United States Patent
Kittl et al.

(10) Patent No.: US 10,510,886 B2
(45) Date of Patent: Dec. 17, 2019

(54) METHOD OF PROVIDING REACTED METAL SOURCE-DRAIN STRESSORS FOR TENSILE CHANNEL STRESS

(71) Applicant: Samsung Electronics Co., Ltd., Gyeonggi-do (KR)

(72) Inventors: Jorge A. Kittl, Lakeway, TX (US); Ganesh Hegde, Austin, TX (US)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 12 days.

(21) Appl. No.: 15/872,455

(22) Filed: Jan. 16, 2018

(65) Prior Publication Data
US 2019/0131451 A1 May 2, 2019

Related U.S. Application Data

(60) Provisional application No. 62/577,610, filed on Oct. 26, 2017.

(51) Int. Cl.
*H01L 29/78* (2006.01)
*H01L 21/768* (2006.01)

(52) U.S. Cl.
CPC .... *H01L 29/7845* (2013.01); *H01L 21/76805* (2013.01); *H01L 21/76843* (2013.01); *H01L 21/76889* (2013.01); *H01L 21/76895* (2013.01)

(58) Field of Classification Search
None
See application file for complete search history.

(56) References Cited

U.S. PATENT DOCUMENTS

| | | |
|---|---|---|
| 7,649,232 B2 | 1/2010 | Tamura et al. |
| 8,120,119 B2 | 2/2012 | Fischer et al. |
| 8,415,222 B2 * | 4/2013 | Wang .............. H01L 29/0847 438/301 |
| 8,569,139 B2 | 10/2013 | Nieh et al. |
| 8,716,090 B2 | 5/2014 | Qin |
| 8,796,099 B2 | 8/2014 | Alptekin et al. |
| 9,018,714 B2 | 4/2015 | Cheng et al. |
| 9,472,669 B1 | 10/2016 | Chiang et al. |
| 9,548,210 B2 | 1/2017 | Nemouchi et al. |
| 9,634,140 B2 | 4/2017 | Kittl et al. |
| 9,899,522 B1 * | 2/2018 | Liu .................. H01L 21/283 |
| 10,199,260 B1 * | 2/2019 | Su .................... H01L 21/76805 |

(Continued)

*Primary Examiner* — Angel Roman
(74) *Attorney, Agent, or Firm* — Van Pelt, Yi & James LLP (57) ABSTRACT

A method provides a source-drain stressor for a semiconductor device including source and drain regions. Recesses are formed in the source and drain regions. An insulating layer covers the source and drain regions. The recesses extend through the insulating layer above the source and drain regions. An intimate mixture layer of materials A and B is provided. Portions of the intimate mixture layer are in the recesses. The portions of the intimate mixture layer have a height and a width. The height divided by the width is greater than three. A top surface of the portions of the intimate mixture layer in the recesses is free. The intimate mixture layer is reacted to form a reacted intimate mixture layer including a compound $A_xB_y$. The compound $A_xB_y$ occupies less volume than a corresponding portion of the intimate mixture layer.

17 Claims, 8 Drawing Sheets

(56) References Cited

U.S. PATENT DOCUMENTS

| | | | |
|---|---|---|---|
| 2012/0032275 A1* | 2/2012 | Haran | H01L 21/28518 257/401 |
| 2012/0112280 A1* | 5/2012 | Johnson | H01L 21/76237 257/347 |
| 2012/0187490 A1* | 7/2012 | Fried | H01L 21/26586 257/347 |
| 2015/0263137 A1* | 9/2015 | Chen | H01L 29/401 438/283 |
| 2015/0372142 A1 | 12/2015 | Kuang et al. | |
| 2016/0099321 A1* | 4/2016 | Frohberg | H01L 29/4175 257/384 |
| 2016/0133745 A1* | 5/2016 | Kittl | H01L 29/7845 438/197 |
| 2016/0181383 A1* | 6/2016 | Huang | H01L 29/41758 257/757 |
| 2017/0098707 A1* | 4/2017 | Hung | H01L 21/285 |

\* cited by examiner

METHOD OF PROVIDING REACTED METAL SOURCE-DRAIN STRESSORS FOR TENSILE CHANNEL STRESS

CROSS-REFERENCE TO RELATED APPLICATIONS

This application claims the benefit of provisional Patent Application Ser. No. 62/577,610, filed Oct. 26, 2017, entitled "REACTED METAL SOURCE-DRAIN STRESSOR FOR TENSILE CHANNEL STRESS", assigned to the assignee of the present application, and incorporated herein by reference.

BACKGROUND

It may be desirable to induce a strain in the channel region of a semiconductor device in order to improve performance. Strained silicon in the channel may be produced in a number of manners. For example, silicides in source and/or drain regions can induce strain in channels of metal-oxide-semiconductor MOS devices. In a MOS field effect transistor (MOSFET) a silicide in the source/drain (SD) is typically a result of the reaction of a metal layer with SD/channel materials of the MOSFET. The resulting strains induced on the channel by silicides originate from the difference in coefficients of thermal expansion between the silicide and the substrate/channel material. More specifically, as the device cools from the final silicide phase, the difference in the coefficients of thermal expansion of the silicide and channel material result in the silicide contracting more than the channel material. A tensile stress is, therefore, induced in the channel. However, the magnitude of the stress achievable by this mechanism may be limited. Alternatively, a metal film can be reacted with a semiconductor to the form a compound (e.g. a silicide) that occupies less volume than the combined volumes of the unreacted metal and semiconductor layers. Although some tensile strain may be developed using this method, a significant drawback is the formation of voids.

Consequently, an improved mechanism for providing tensile strain in the channel of a MOS device is desired.

BRIEF SUMMARY OF THE INVENTION

A method for providing a source-drain stressor for a semiconductor device channel is described. The semiconductor device includes a source region and a drain region. Recesses are formed in the source region and in the drain region. An insulating layer covers the source and drain regions. The recesses extend through portions of the insulating layer above the source and drain regions. An intimate mixture layer of materials A and B is provided. A portion of the intimate mixture layer is in the each of the recesses. The portion of the intimate mixture layer has a height and a width. The height divided by the width is an aspect ratio greater than three. A top surface of each of the portions of the intimate mixture layer is free. The intimate mixture layer is reacted to form a reacted intimate mixture layer. The reacted intimate mixture layer includes a compound $A_xB_y$. The compound $A_xB_y$ occupies a volume less than an original volume of a corresponding portion of the intimate mixture layer.

The method described herein may more simply and easily form a metal SD that induces a tensile strain on the channel and may have a low contact resistivity. The contact resistivity optimization may be optimized separately from the stress, a wide range of metals including non-silicide metal alloys may be used, diffusion into the channel may be reduced or eliminated and cracking or void formation mitigated or prevented. Consequently, a MOS device having improved performance and yield may be fabricated.

BRIEF DESCRIPTION OF SEVERAL VIEWS OF THE DRAWINGS

FIGS. 4-8C depict portions of an exemplary embodiment of a semiconductor device during fabrication of the source-drain stressor.

DETAILED DESCRIPTION OF THE INVENTION

The exemplary embodiments relate to formation of metal stressors for the channels of semiconductor devices such as MOS devices. The following description is presented to enable one of ordinary skill in the art to make and use the invention and is provided in the context of a patent application and its requirements. Various modifications to the exemplary embodiments and the generic principles and features described herein will be readily apparent. The exemplary embodiments are mainly described in terms of particular methods and systems provided in particular implementations. However, the methods and systems will operate effectively in other implementations.

Phrases such as "exemplary embodiment", "one embodiment" and "another embodiment" may refer to the same or different embodiments as well as to multiple embodiments. The embodiments will be described with respect to systems and/or devices having certain components. However, the systems and/or devices may include more or fewer components than those shown, and variations in the arrangement and type of the components may be made without departing from the scope of the invention. The exemplary embodiments will also be described in the context of particular methods having certain steps. However, the method and system operate effectively for other methods having different and/or additional steps and steps in different orders that are not inconsistent with the exemplary embodiments. Thus, the present invention is not intended to be limited to the embodiments shown, but is to be accorded the widest scope consistent with the principles and features described herein.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

A method for providing a source-drain stressor for a semiconductor device channel is described. The semiconductor device includes a source region and a drain region. Recesses are formed in the source and drain regions. An insulating layer covers the source and drain regions. The recesses extend through portions of the insulating layer above the source and drain regions. An intimate mixture layer of materials A and B is provided. A portion of the intimate mixture layer is in the each of the recesses. The portion of the intimate mixture layer has a height and a width. The height divided by the width is an aspect ratio greater than three. In some embodiments, the aspect ratio is at least four. A top surface of each of the portions of the intimate mixture layer is free. The intimate mixture layer is reacted to form a reacted intimate mixture layer. The reacted intimate mixture layer includes a compound $A_xB_y$. The compound $A_xB_y$ occupies a volume less than an original volume of a corresponding portion of the intimate mixture layer.

Figure 1:
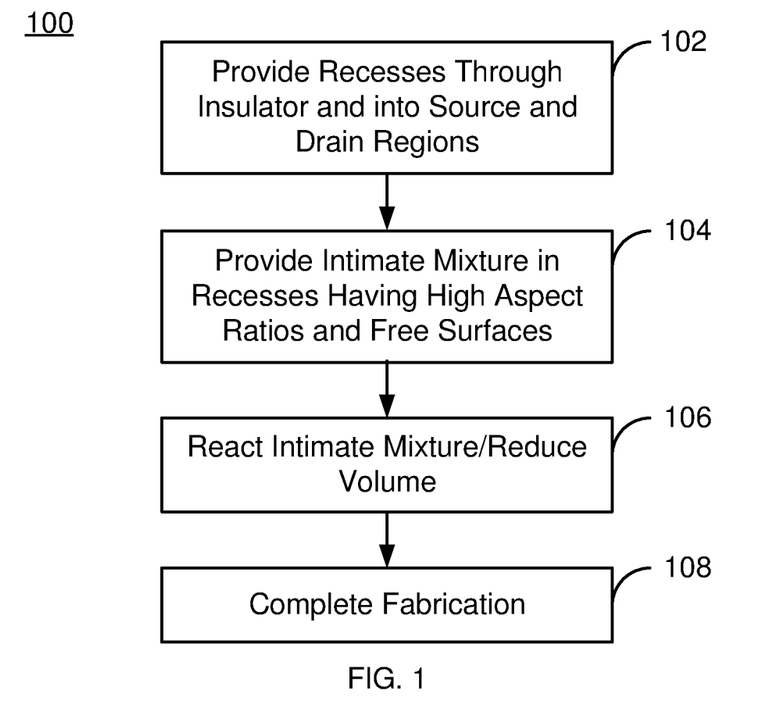
FIG. 1 is a flow chart depicting an exemplary embodiment of a method for providing a source-drain stressor in a semiconductor device.
Figure 2A:
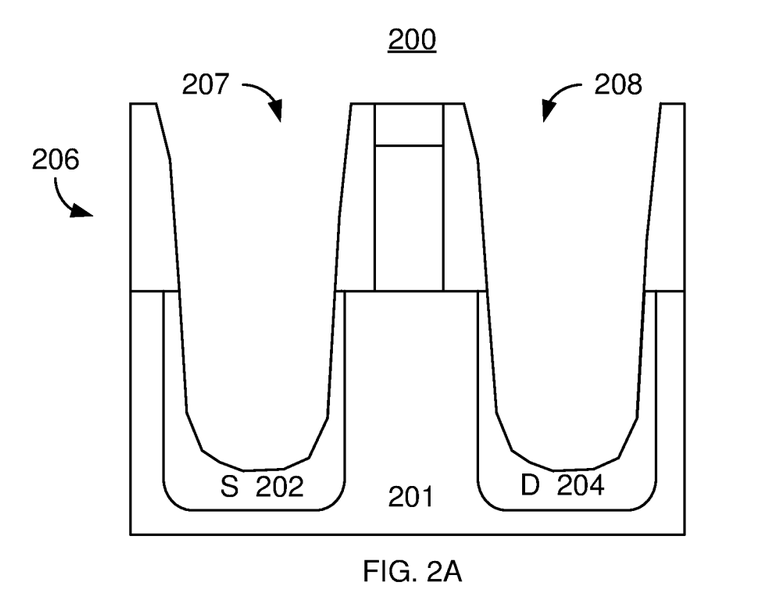
FIGS. 2A-2C depict portions of an exemplary embodiment of a semiconductor device during fabrication of the source-drain stressor.
Figure 2B:
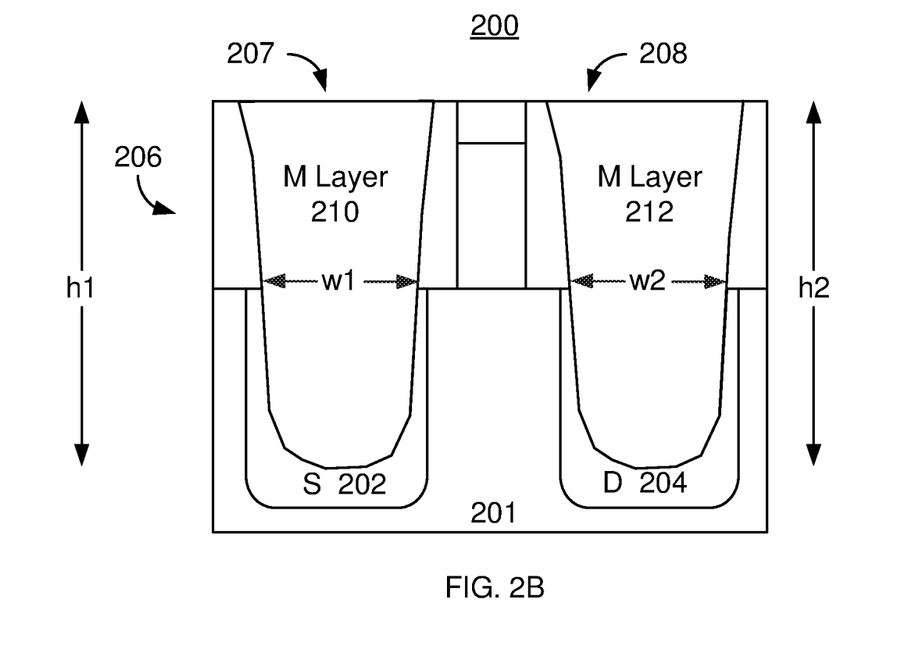
Figure 2C:
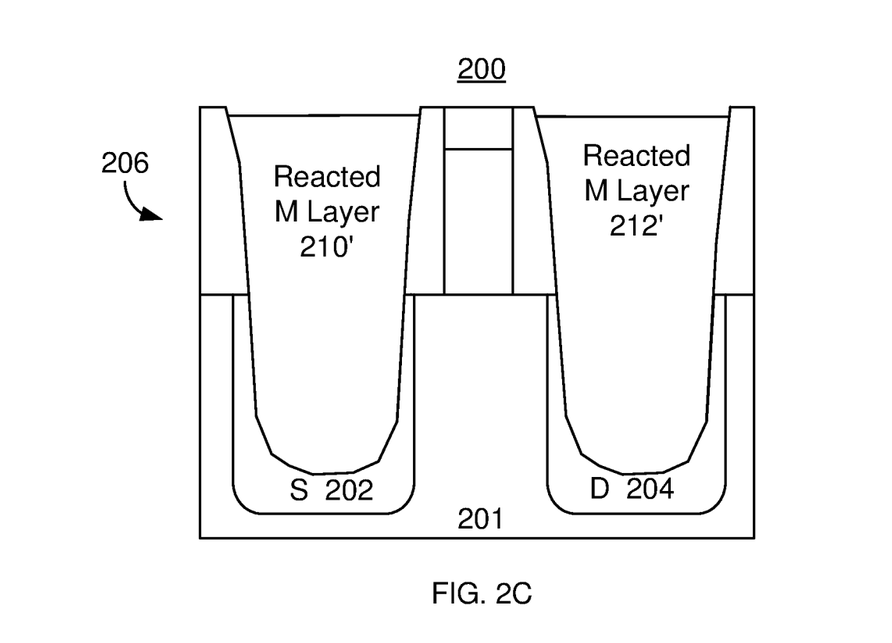

FIG. 1 is a flow chart depicting an exemplary embodiment of a method 100 for providing a source-drain stressor in a semiconductor device. The source-drain stressor provided is metal and induces a tensile stress in the channel. For simplicity, some steps may be omitted, performed in another order and/or combined. Further, the method 100 may start after other steps in forming the semiconductor device have been performed. For example, the method may start after a gate has been provided and source and drain regions defined. FIGS. 2A-2C depict portions of an exemplary embodiment of a semiconductor device 200, such as a MOS device, during fabrication of the source-drain stressor using the method 100. For simplicity, not all components are shown in FIGS. 2A-2C and FIGS. 2A-2C are not to scale. Consequently, the method 100 is described in the context of the semiconductor device 200.

Recesses are formed in the source and drain regions, via step 102. Because the source and drain region are covered by an insulating layer, the recesses are formed by etching through the insulating layer and into the underlying semiconductor. FIG. 2A depicts the semiconductor device 200 after step 102 is performed. The semiconductor device 200 includes a semiconductor 201 having source region 202 and drain region 204. A channel is between the source region 202 and drain region 204. An insulating layer 206 resides on the semiconductor 201. The insulating layer 206 may have a number of sublayers. Also shown are recesses 207 and 208 formed in step 102. Thus, the recesses 207 and 208 extend through the insulating layer 206 and into the source region 202 and drain region 204, respectively. The recesses 207 and 208 have a height that is much larger than their width and, therefore, a high aspect ratio. The recesses 207 and 208 may be trenches (having a larger dimension out of the plane of the page) or may be a hole having a dimension out of the plane of the page on the order of the width.

An intimate mixture (M) layer of materials A and B is provided in the recesses 207 and 208, via step 104. In some embodiments, contact layer(s), diffusion barrier layer(s) and/or optional seed layer(s) may be provided before the M layer. The M layer is mixture of A and B and may be amorphous. This mixture may be formed by co-deposition, formation of a nanolaminate stack having thin layer, or in another manner. The thickness of the layers in such a nanolaminate stack may be in the range of 0.1 nm to not more than four nanometers. In some embodiments, the layers of the nanolaminate stack have a thickness of not more than three nanometers. The M layer may be formed at a relatively low temperature, such as not more than three hundred degrees Celsius. In some embodiments the M layer is formed at room temperature. The M layer is such that after an appropriate heat treatment, the M layer forms a reacted M layer. Stated differently, at least some of the mixture of A and B in the (unreacted) M layer reacts to form a compound $A_xB_y$ that is part of the reacted M layer. The compound $A_xB_y$ occupies less volume than the original volume of A and B of the M layer. The decrease in volume between the mixture of A and B and the compound $A_xB_y$ is desired to be sufficiently large to provide a tensile stress in the channel, but small enough to prevent cracking. For example, the decrease in volume may be not more than ten percent. In some embodiments, the reduction in volume is at least one percent.

In some embodiments, A is a metal and B is a semiconductor. For example, A may be Ni, Co, Ti, Ta, W, Mo, or other refractory metal and B may be Si or a SiGe alloy. The compound $A_xB_y$ may be a metallic silicide or germanosilicide phase such as Ni silicide or Co silicide, which could be metal-rich silicide phases. The proportions of A and B are chosen to lead to the $A_xB_y$ compound embedded in a matrix of or forming a nanolaminate structure with the metal A. In some embodiments B is Si or a SiGe alloy, the compound $A_xB_y$ is a low resistivity silicide or germanosilicide phase (e.g. NiSi or $CoSi_2$). In some embodiments, A is a metal and is 70 to 90 atomic percent within the layer M. In other embodiments A and B are metals. Thus, the primary constituent(s) of the M layer are metal(s).

FIG. 2B depicts the semiconductor device 200 after step 104 is performed. Thus, M layers 210 and 212 in recesses 207 and 208, respectively, are shown. The M layers 210 and 212 are shown as filling the recesses 207 and 208. In other embodiments, the M layers 210 and/or 212 need not fill the recesses 207 and/or 208, respectively. However, the M layers 210 and 212 are generally desired to extend well above the top of the source region 202 and drain region 204. Stated differently, the M layer 210 and M layer 212 extend past the top of the semiconductor 201. In some embodiments, the M layer 212 extends up to or beyond the gate.

Regardless of how far they extend past the top of the semiconductor 201, the M layers 210 and 212 have a high aspect ratio. The M layer 210 has a height h1 and a width w1. Because the recess 207 have a varying width, w1 may be an average width and/or may be taken approximately halfway down the recess 207. The aspect ratio of M layer 210 is h1/w1 and is greater than three. In some embodiments, h1/w1 is not less than four. For example, in some embodiments, h1/w1 is nominally six. Similarly, the M layer 212 has a height h2, a width w2 and an aspect ratio h2/w2. The aspect ratio h2/w2 is desired to be in the same range as the aspect ratio h1/w1. In the embodiment shown, h1=h2, w1=w2 and h1/w1=h2/w2. However, in other embodiments, one or more of these may differ. In addition, the top surface of each of the M layers 210 and 212 is free. Stated differently, the top surfaces of the M layers 210 and 212 are exposed.

The M layers 210 and 212 are to form reacted M layers including a compound $A_xB_y$ within the reacted intimate mixture layer, via step 106. Step 106 may include raising the temperature of the semiconductor device 200 to above three hundred degrees Celsius. The resulting compound $A_xB_y$ occupies a volume less than an original volume of a corresponding portion of the intimate mixture layer. FIG. 2C depicts the semiconductor device 200 after step 106 is performed. Thus, reacted M layers 210' and 212' have been formed. Some portion (including all) of the reacted M layers 210' and 212' have been converted from a mixture of A and B to $A_xB_y$. The reacted M layers 210' and 212' occupy less volume than the M layers 210 and 212, respectively. The reacted M layers 210' and 212' thus induce a tensile strain on the channel between the source region 202 and drain region 204. Consequently, nMOS charge carriers have increased mobility.

Using the method 100, performance of the semiconductor device 200 may be improved. The amount of stress capable of being induced by the reacted M layers 210' and 212' is greater than for mechanisms that rely on differences in the coefficients of thermal expansion. This may be accomplished in a relatively simple manner. If a contact layer (not shown in FIGS. 2A-2C) is deposited, the source 202 and drain 204 may have low contact resistivity that may be separately optimized from the stress. A wide range of reacted metal stressors including non-silicide metallic alloys may be fabricated using the method 100. Thus, reacted alloys can be chosen to optimize both stress and alloy resistivity. Diffusion or encroachment to channel by the materials in the M layers 210 and 212 may be prevented or mitigated by a diffusion barrier (not shown). Thus, reacted layers 210' and 212' may be in close proximity to channel. By controlling the materials and stoichiometry, the volume reduction and stress can be tailored to prevent cracking and void formation. Void formation may also be prevented. Thus, yield and device performance may be improved.

Figure 3:
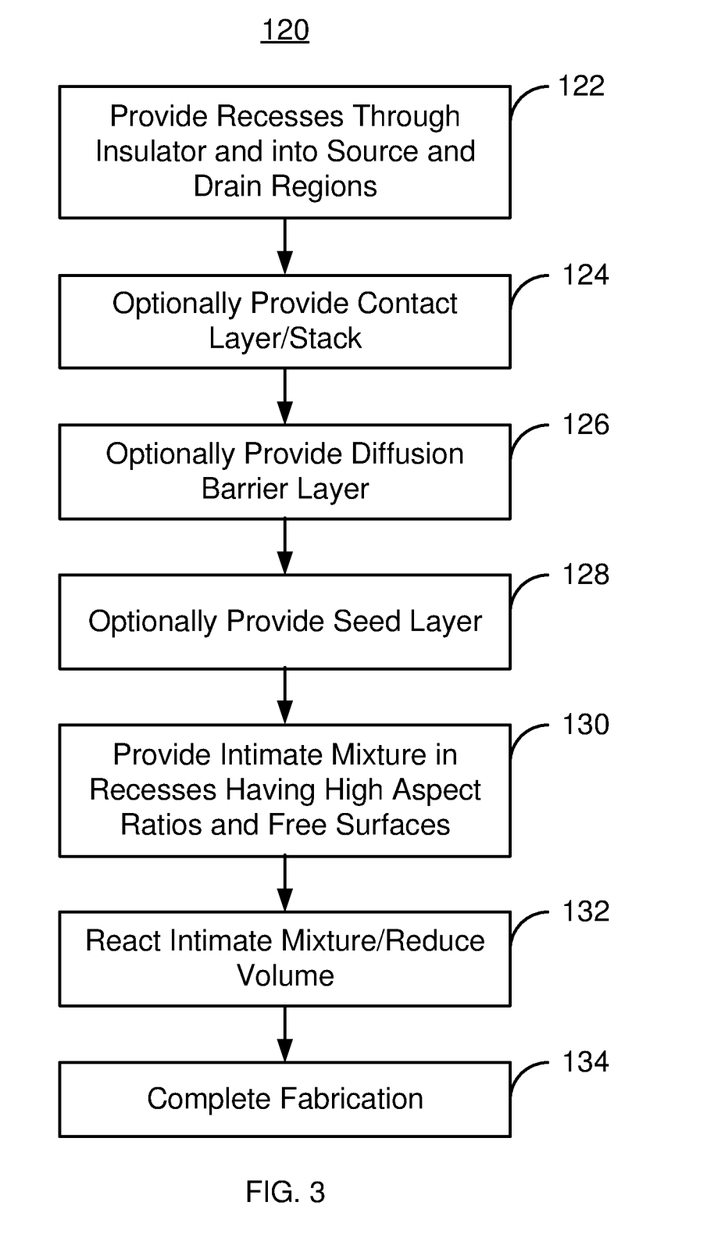
FIG. 3 is a flow chart depicting another exemplary embodiment of a method for providing a source-drain stressor for a channel in a semiconductor device.

FIG. 3 is a flow chart depicting an exemplary embodiment of a method 120 for providing a source-drain stressor in a MOS device. The source-drain stressor provided is metal and induces a tensile stress in the channel. For simplicity, some steps may be omitted, performed in another order and/or combined. Further, the method 100 may start after other steps in forming the semiconductor device have been performed. For example, the method may start after a gate has been provided and source and drain regions defined. FIGS. 4-8C depict portions of exemplary embodiments of a MOS device 250 during fabrication of the source-drain stressor using the method 120. For simplicity, not all components are shown in FIGS. 4-8C and FIGS. 4-8C are not to scale. The method 120 is described in the context of the semiconductor device 250.

Figure 4:
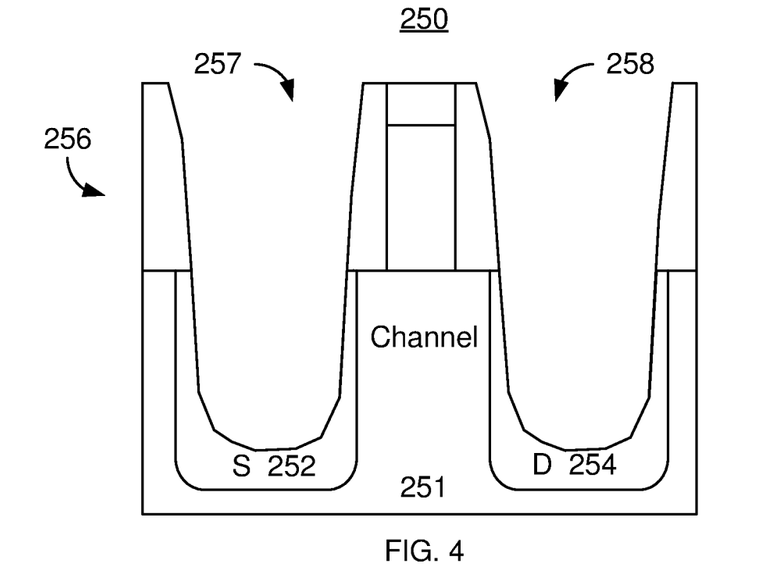

Recesses are formed in the source and drain regions, via step 122. The recesses may be trenches or holes. Step 122 is analogous to step 102 of the method 100. Because the source and drain region are covered by an insulating layer, the recesses are formed by etching through the insulating layer and into the underlying semiconductor. FIG. 4 depicts the MOS device 250 after step 202 is performed. The semiconductor device 200 includes a semiconductor 251 having source region 252 and a drain region 254. An insulating layer 256 resides on the semiconductor 251 and may be a multilayer. Also shown are recesses 257 and 258 formed in step 122. Thus, the recesses 227 and 228 extend through the insulating layer 256 and into the source region 252 and drain region 254, respectively. The aspect ratios for the recesses 227 and 228 may be high as defined above in order to ensure that the intimate mixture (discussed below) also has a high aspect ratio. For example, in some embodiments, the aspect ratio of the apertures 257 and 258 is at least four.

Figure 5A:
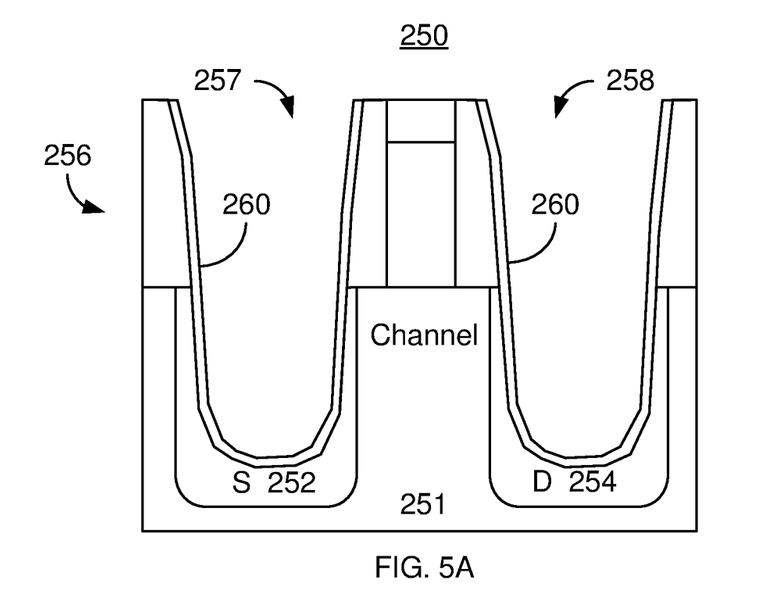
Figure 5B:
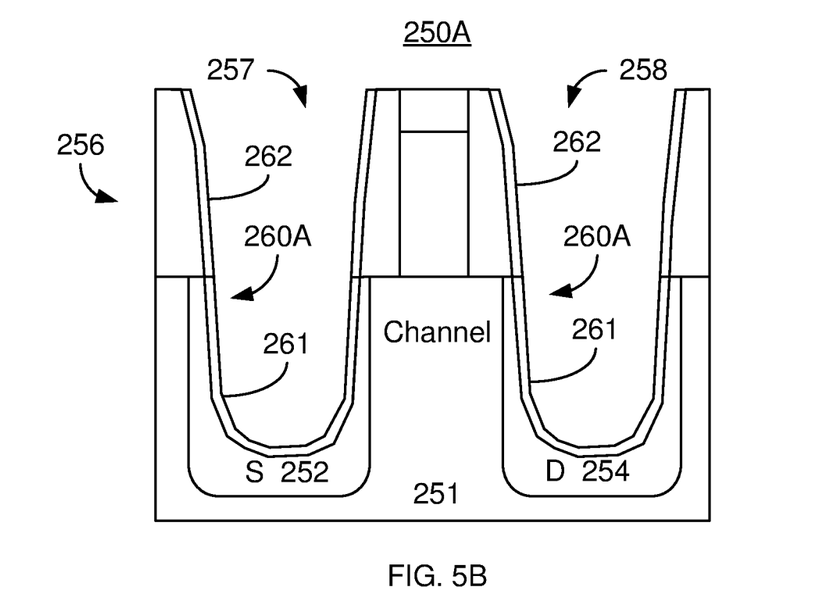
Figure 5C:
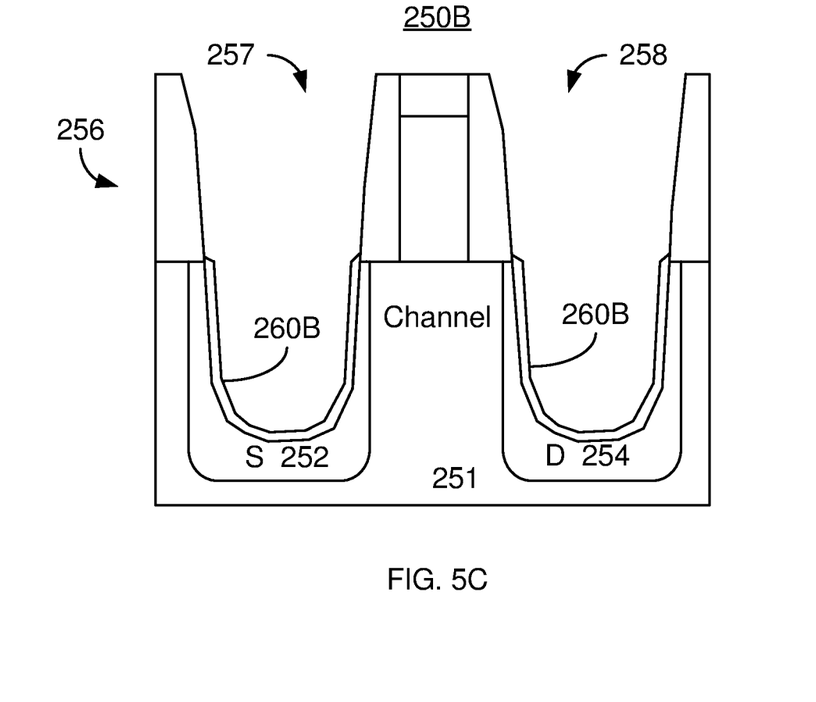

A contact layer may optionally be provided in the recesses 257 and 258, via step 124. The contact layer may be a thin metal layer or a stack including multiple sublayers. The thickness of the contact layer may not exceed five nanometers in some embodiments. In some cases, the contact layer may be at least one nanometer and not more than three nanometers thick. FIGS. 5A-5C depict various embodiments of MOS devices having different contact layers. FIG. 5A depicts the MOS device 250 in which the contact layer 260 is on the sides of the entirety of the recesses 257 and 258. Thus, part of the contact layer 260 not only adjoins the source region 252 and drain region 254, but also the insulating layer 256. Although the contact layer 260 may be a multilayer, for simplicity a single layer is shown. FIG. 5B depicts a MOS device 250A in which the contact layer includes two parts. One portion 261 is adjacent to the source region 252 and drain region 254. Another portion adjoins 262 the insulating layer 256. Each portion 261 and 262 may be a single layer or a multilayer. FIG. 5C depicts another MOS device 250B in which the contact layer 260B is present only in the areas adjoining the source region 252 and the drain region 254. The contact layer 260B may be formed via a self-aligned reacted metal-semiconductor processes (such as salicide processes). Thus, the contact stack may be only present in regions next to the semiconductor. The contact layer 260B may thus be a single layer. In other embodiments, the contact layer 260B may be a multilayer.

The contact layers 260, 260A and 260B allow for a low contact resistivity interface to the semiconductor/source/drain regions 252 and 254. The metal or reacted metal in the contact layer 260, 260A and 260B may include one or more of Ti, Ti-compounds, Co, Co compounds, Ni, Ni compounds, refractory metals, reacted refractory metals, rare-earth metals, rare-earth metals, heavy alkaline earth metals and/or reacted heavy alkaline earth metals. The formation of the contact layers 260, 260A and 260B may optionally include additional processes. For example, dopant segregation, impurity segregation, chalcogenide passivation and the like may be performed. Such processes aid in achieving a low interface contact resistance and a stable interface. Subsequent steps are described primarily in the context of the MOS device 260. However, the discussion herein is also applicable to the MOS devices 260A and 260B.

Figure 6:
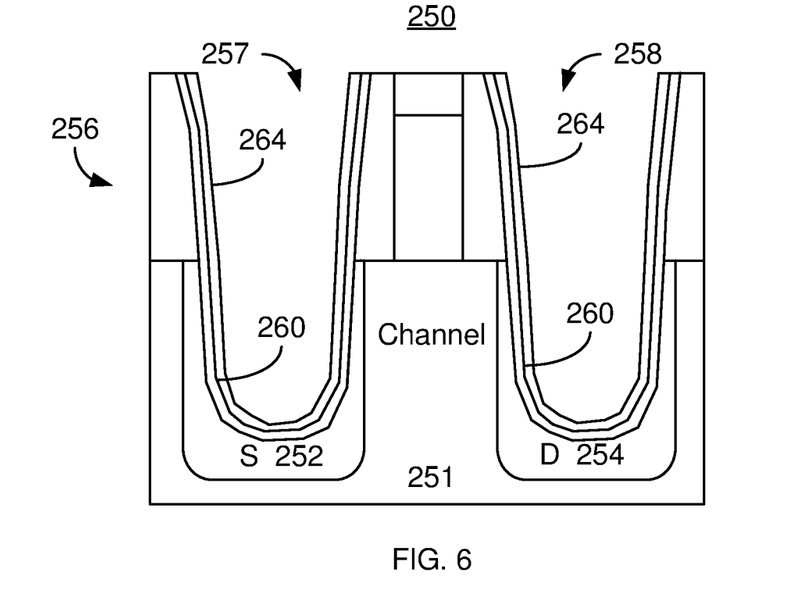

A diffusion barrier layer is optionally provided, via step 126. If the contact layer 260/260A/260B provided in step 124 can function as a diffusion barrier for the intimate mixture layer, then step 126 may be omitted. Alternatively, if the diffusion barrier formed in step 126 can provide the desired low contact resistance, then step 124 may be skipped. FIG. 6 depicts the MOS device 250 after step 126 is performed. Thus, a diffusion barrier 264 is shown. The diffusion barrier 264 may be thin and metallic. For example, the diffusion barrier may be not more than five nanometers thick. Materials such as TiN, TaN, TiSiN, TaSiN, a nitrided Ti compound, a nitrided Ta compound and the like may be used for the diffusion barrier. Although shown as a single layer, the diffusion barrier may be a multilayer. This diffusion barrier 264 blocks or reduces diffusion of materials in the intimate layer (e.g. A and B) from diffusing into the semiconductor or wafer 251.

Optionally, a seed layer may be provided, via step 128. Such a seed layer may be thin, for example not exceeding four nanometers. The seed layer may aid in nucleation of compound $A_xB_y$. In some embodiments, the seed layer may contain the compound $A_xB_y$. In some embodiments, the thin seed layer is formed by deposition of a thin layer containing materials A and B and then reacted to form compound $A_xB_y$. For clarity, the thin seed layer is not depicted in the drawings.

Figure 7:
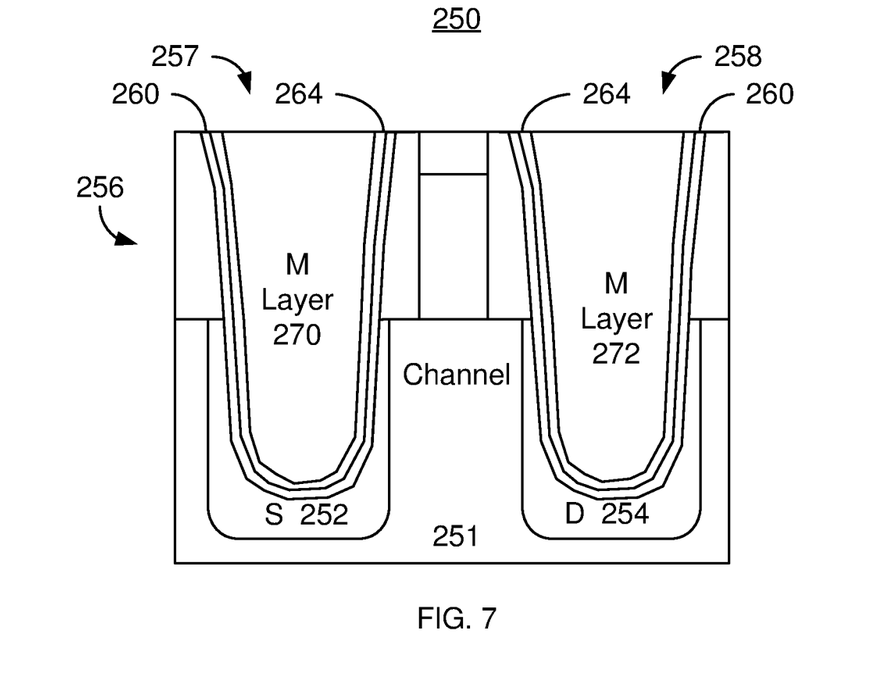

An intimate mixture (M) layer of materials A and B is provided in the recesses 257 and 258, via step 130. Step 130 is analogous to step 104 of the method 100. A and B materials for step 130 are analogous to and may be the same as those used in step 104. FIG. 7 depicts the MOS device 250 after step 130 has been performed. Consequently, M layers 270 and 272 in the recesses 257 and 258, respectively, are shown. Although denoted with different numerals, the M layers 270 and 272 may be formed together and be substantially the same. The M layers 270 and 272 may substantially fill the recesses 257 and 258, respectively, as shown. Thus, the M layer 270/272 not only fills the portion of the recess for the source 252/drain 254 but also the apertures in the insulating layer 256. In other embodiments, the M layer 270/272 may not extend to the top of the insulating layer 256. However, the M layer 270/272 is generally desired to extend past the top surface of the semiconductor 251. The M layer 270/272 may be an amorphous mixture of A and B. Step 130 may be carried out by co-deposition, or deposition from a composite or mixed source or target, deposited via ALD, deposited using CVD, deposited using PVD or co-deposited in an analogous manner. The M layer 270/272 may also be formed by nanolaminate stack with layer thicknesses for example in the 0.1 nm to four nanometer range. Use of deposition techniques such as CVD or ALD allow the M layer 270/272 to be deposited conformally. Use of techniques such as PVD allow for the deposition to be directional.

Materials A and B and their relative content in the M layer 270/272 are chosen such that a compound $A_xB_y$ is formed in a reaction, described below; such that the M layer 270/272 is metallic after the reaction; such that the M layer 270/272 has low resistivity after the reaction, and such that the M layer 270/272 has a smaller volume if in relaxed (post-reaction) state than in its as-deposited (pre-reaction) state. M layer 270/272 may have a larger coefficient of thermal expansion than the semiconducting SD/channel 251. In some embodiments, the M layer as formed is a mixture of A and B in proportions that lead to a close to stoichiometric $A_xB_y$ compound. In other embodiments, the M layer 270/272 is formed is a mixture of A and B in proportions that lead to formation of an $A_xB_y$ compound in a matrix of A or in a nanolaminate structure with additional layers of substantially A. In some embodiments, step 130 forms the layer M at low temperature (e.g. at room temperature or a temperature less than three hundred degrees Celsius) in step 130. In some embodiments, the layer M as formed is amorphous.

As discussed above, the M layer 270/272 may be formed as a nanolaminate. In some embodiments, M layer 270/272 as formed is composed of a nanolaminate structure in which layers of mixtures of A and B (e.g. amorphous layers) can be alternated with layers of A. Such a nanolaminate may be used to target specific volume contractions upon formation of compound $A_xB_y$ in the reaction discussed below. In such an embodiment, some residual amount of A may remain. In some embodiments, M layer 270/272 as formed is composed of a nanolaminate of A and B, such that the resulting structure after reaction is a compound $A_xB_y$ and, optionally, additional A (either in nanolaminate or other resulting geometry). In some embodiments, M layer 270/272 as-deposited has compound phases within, but not in the final targeted $A_xB_y$ compound structure. In some embodiments, $A_xB_y$ is crystalline. In some embodiments, the M layer 270/272 after the reaction discussed below either consists substantially of compound $A_xB_y$ or consists substantially of a mixture of compound $A_xB_y$ and A. The stoichiometries are selected such that the theoretical volume contraction (comparing the initial volume of the deposited mixture of A and B to the final volume in hypothetical relaxed state of the resulting layer after reaction) is not excessive but still sufficient to provide the desired strain in the channel. Consequently, the M layer 270/272 may not crack or void due to the reaction. The actual volume contraction targeted may be at least one percent and not more than ten percent to reduce or prevent cracking or voiding. In some embodiments the volume contraction targeted is at least one percent and not more than five percent.

In addition to depositing the M layers 270/272, step 130 may carry out a planarization step such as chemical mechanical polishing (CMP). Such a step may remove a portion of the M layer 270/272 formed on the top horizontal surfaces of the pre-metal dielectric 256. This CMP step may be implemented before or after reaction of the M layer (i.e. before or after step 132). However, the top surface of the M layers 270/272 is free/exposed prior to step 132, discussed below. The aspect ratio of the M layers 270/272 is substantially the same as for the M layers 210 and 212.

Figure 8A:
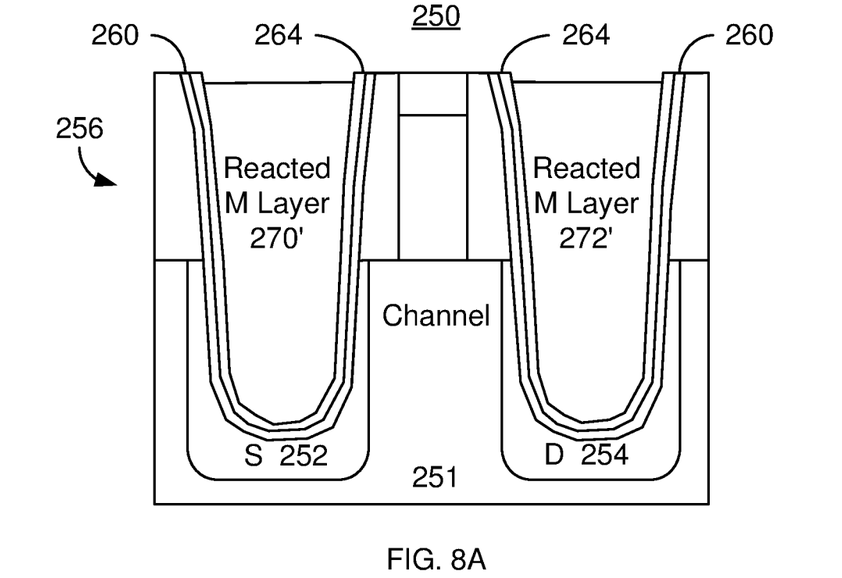
Figure 8B:
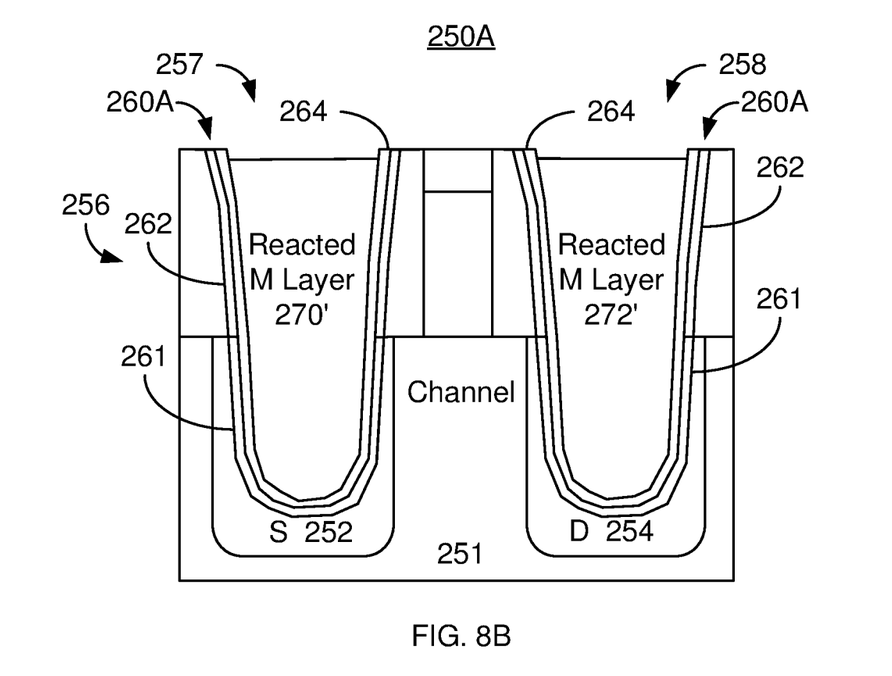
Figure 8C:
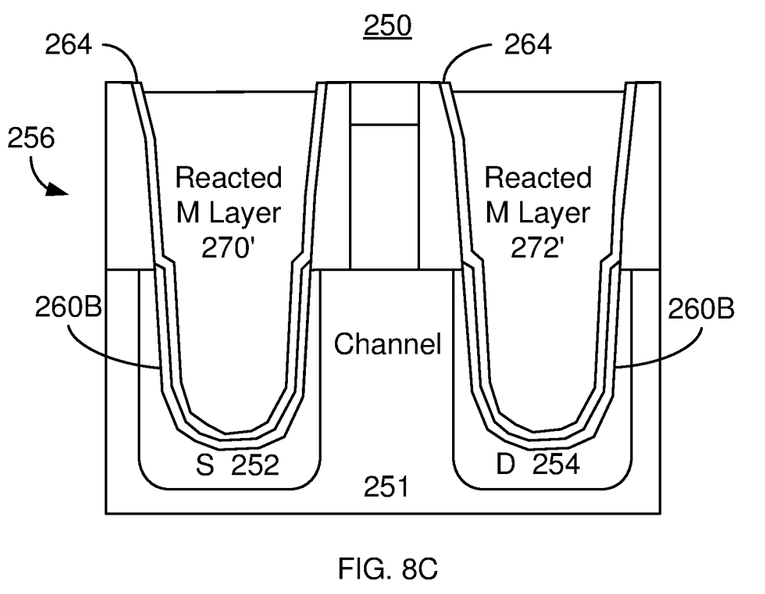

The M layers 270/272 are to form reacted M layers including the compound $A_xB_y$, via step 132. Step 132 is analogous to step 106. Thus, the compound $A_xB_y$ is formed within the M layer 270/272, for example by a thermal process. FIGS. 8A-8C depict MOS devices 250, 250A and 250B after step 132 is performed. Thus, the reacted M layers 270' and 272' have been formed. FIG. 8A depicts the MOS device 250 using contact layer 260. FIG. 8B depicts the MOS device 250A having contact layer 260A, while FIG. 8C depicts the MOS device 250B having contact layer 260B. Materials A and B were chosen so that the volume of M layer after reaction (reacted M layer 270'/272') would be smaller if in relaxed state than the volume of the M layer 270/272 before reaction and such that the resulting (reacted) M layer 270'/272' is metallic. Because M layer 270/272 is formed within a high aspect ratio structure and because the intimate mixture of the as deposited layer prevents void formation (and allows lower temperature reaction than in thicker bi-layers), metallic layers 270'/272' with tensile stress is achieved in the recesses within the SD 252/254 after reaction. Additional stress can build up in cooling. The result is a SD metal stressor layer 270'/272' that induces tensile strain in the channel. The diffusion barrier 264 prevents A, B and $A_xB_y$ from diffusing into to the channel/substrate 251. In the preferred embodiments, $A_xBy$ is a crystalline compound. In some embodiments, the reacted M layer 270'/272' is either substantially made of compound $A_xB_y$ or is substantially made of a mixture of compound $A_xB_y$ and A. Thus, the volume contraction is not excessive. Hence, the reacted M layer 270'/272' does not crack or void. The actual volume contraction may be targeted should be in the few percentage range described above. In some embodiments, the reaction thermal budget to form compound AxBy is kept below the thermal budget of stress relaxation.

The method 120 shares the benefits of the method 100. Performance of the semiconductor device 250 may be improved without unduly complicating manufacturing. More specifically, a larger amount of tensile stress may be induced in the channel by the reacted M layers 270' and 272'. This may be accomplished in a relatively simple manner. The contact layer 260/260A/260B allows for a low contact resistivity that may be separately optimized from the stress. A wide range of reacted metal stressors including non-silicide metallic alloys may be fabricated using the method 120. Thus, reacted alloys can be chosen to optimize both stress and alloy resistivity. Diffusion or encroachment to channel by the materials in the M layers 270/270' and 272/272' may be prevented or mitigated by the diffusion barrier 264 and/or contact layer 260/260A/260B. Thus, reacted layers 270' and 272' may be in close proximity to channel. By controlling the materials and stoichiometry, the volume reduction and stress can be tailored to prevent cracking and void formation. Thus, yield and device performance may be improved.

Various features have been described with respect to the methods 100 and 120 and the devices 200, 250, 250A and 280B. One of ordinary skill in the art will recognize that these features may be combined in manner(s) not shown and which are not inconsistent with the devices and methods described herein.

A method and system for integrating heterogeneous elements into semiconductor devices have been described. The method and system have been described in accordance with the exemplary embodiments shown, and one of ordinary skill in the art will readily recognize that there could be variations to the embodiments, and any variations would be within the spirit and scope of the method and system. Accordingly, many modifications may be made by one of ordinary skill in the art without departing from the spirit and scope of the appended claims.

We claim:

1. A method for providing a source-drain stressor for a semiconductor device channel, the semiconductor device including a source region and a drain region, the method comprising:

forming a first recess in the source region and a second recess in the drain region, an insulating layer covering the source and drain regions, the first recess extending through a first portion of the insulating layer above the source region, the second recess extending through a second portion of the insulating layer above the drain region;

providing an intimate mixture layer of materials A and B, a first portion of the intimate mixture layer residing in the first recess, a second portion of the intimate mixture layer residing in the second recess, the first portion of the intimate mixture layer having a first height and a first width, the second portion of the intimate mixture layer having a second height and a second width, the first height divided by the first width being a first aspect ratio greater than three, the second height divided by the second width being a second aspect ratio greater than three, a top surface of the first and second portions of the intimate mixture layer being free;

reacting the intimate mixture layer to form a reacted intimate mixture layer including a compound $A_xB_y$, the compound $A_xB_y$ occupying a volume less than an original volume of a corresponding portion of the intimate mixture layer, the top surface of the first and second portions of the intimate mixture layer being free during at least a portion of the reacting the intimate mixture layer.

2. The method of claim 1 wherein the first aspect ratio and the second aspect ratio are each at least four.

3. The method of claim 1 wherein the first aspect ratio and the second aspect ratio are each at least six.

4. The method of claim 1 further comprising:

providing a contact layer in the first recess and the second recess before the step of providing the intimate mixture layer.

5. The method of claim 4 wherein the contact layer includes a plurality of sublayers.

6. The method of claim 4 wherein the contact layer resides only in a portion of the first recess corresponding to the source region and a portion of the second recess corresponding to the drain region.

7. The method of claim 4 wherein the contact layer includes a first portion in the first and second recesses in the source and drain regions and a second portion in the first and second recesses extending through the insulating layer.

8. The method of claim 1 further comprising:

providing a diffusion barrier layer in the first recess and the second recess.

9. The method of claim 8 wherein the diffusion barrier includes at least one of TiN, TaN, TiSiN, TaSiN, a nitrided Ti compound, a nitrided Ta compound and wherein the diffusion barrier is less than five nanometers thick.

10. The method of claim 4 further comprising:

providing a diffusion barrier layer on the contact layer in the first recess and the second recess.

11. The method of claim 1 wherein the reacted intimate mixture layer occupies substantially all of the intimate mixture layer.

12. The method of claim 1 wherein the step of providing the intimate mixture layer further includes:

at least one of co-depositing A and B, providing a nanolaminate stack of A and B, each of the layers in the nanolaminate stack having a thickness of at least 0.1 nm and not more than 3 nm.

13. The method of claim 1 wherein the semiconductor device includes a gate between the source region and the drain region, the intimate mixture layer extending from a bottom of the first recess and a bottom of the second recess at least to the gate.

14. The method of claim 1 further comprising:

providing a seed layer for the intimate mixture layer.

15. The method of claim 1 wherein A is at least one of Ni, Co, Ti, Ta, W and Mo and B is at least one of Si and a SiGe alloy.

16. The method of claim 1 wherein the volume is not more than ten percent less than the original volume.

17. The method of claim 1 wherein the top surface of the first and second portions of the intimate mixture layer remain free throughout the reacting the intimate mixture layer to form the reacted intimate mixture layer.

* * * * *